US012772604B2

(12) United States Patent
Song et al.

(10) Patent No.: US 12,772,604 B2
(45) Date of Patent: Oct. 20, 2026

(54) WAFER SINGULATING METHOD AND LED CHIP AND LIGHT EMITTING MODULE

(71) Applicant: TIANJIN SANAN OPTOELECTRONICS CO., LTD., Tianjin (CN)

(72) Inventors: Di Song, Tianjin (CN); Yuxian Tian, Tianjin (CN); Xinjie Ding, Tianjin (CN); Chao Jin, Tianjin (CN); Dongyan Zhang, Tianjin (CN); Duxiang Wang, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 376 days.

(21) Appl. No.: 18/531,400

(22) Filed: Dec. 6, 2023

(65) Prior Publication Data

US 2024/0213397 A1 Jun. 27, 2024

(30) Foreign Application Priority Data

Dec. 21, 2022 (CN) ......................... 202211648076.6

(51) Int. Cl.
*H10H 20/01* (2025.01)
*H10H 20/83* (2025.01)

(52) U.S. Cl.
CPC ............ *H10H 20/01* (2025.01); *H10H 20/83* (2025.01)

(58) Field of Classification Search
CPC ....... H10H 20/01; H10H 20/83; H10H 20/819
See application file for complete search history.

(56) References Cited

U.S. PATENT DOCUMENTS

2006/0284195 A1* 12/2006 Nagai .................. H10H 20/814
257/E33.068

FOREIGN PATENT DOCUMENTS

CN 104752571 A * 7/2015 .............. H10P 54/00
JP 2002018830 A * 1/2002

* cited by examiner

*Primary Examiner* — Sitaramarao S Yechuri
(74) *Attorney, Agent, or Firm* — Muncy, Geissler, Olds & Lowe, P.C.

(57) ABSTRACT

A wafer singulating method includes: providing a wafer product having front and back sides the front side being formed with scribe lines; deep scribing with a laser along the scribe lines on the front side to form a plurality of intersecting trenches; and cleaving the back side along the trenches on the front side. The cleaving of the back side proceeds in different directions each of which is directed to a center of the wafer product from a periphery of the wafer product. The cleaving in each of the directions proceeds along the trenches one after the other from one of the trenches nearest to the periphery of the wafer product and ceases near or at the center.

7 Claims, 8 Drawing Sheets

WAFER SINGULATING METHOD AND LED CHIP AND LIGHT EMITTING MODULE

CROSS-REFERENCE TO RELATED APPLICATION

This application claims priority to Chinese Invention Patent Application No. 202211648076.6, filed on Dec. 21, 2022, and incorporated by reference herein in its entirety.

FIELD

The disclosure relates to a wafer singulating method, and more particularly to a wafer singulating method to obtain LED chips from a wafer product and a light-emitting module using the LED chips.

BACKGROUND

Wafer singulation is a key process when fabricating semiconductors for light-emitting devices or displays. Wafer singulation is conventionally conducted via laser dicing. Referring to FIG. 1*a*, a conventional singulating method may include front side laser scribing, back side laser scribing, back side dicing using a cutting blade, and wafer cleaving. The front side laser scribing produces grooves with a preset depth on the front side of a wafer; the grooves do not fully cut through the wafer and are prepared for use in wafer cleaving. The back side laser scribing is to mark the back side of the wafer with shallow marked lines; after the back side is marked, images of the marked lines are captured by a CCD camera for use as identification images during the back side dicing. The back side dicing cuts the wafer with a cutting blade based on the images of the marked lines on the back side of the wafer to form grooves of a preset depth that do not fully cut through and split the wafer. During the wafer cleaving, the wafer is cleaved and split along the grooves on the front side and the back side to divide the wafer into singulated individual chips.

The conventional laser dicing method has various drawbacks. For instance, wafer back side laser scribing is performed with a marking machine, where the wafer is attached to a white film that is placed on a transparent quartz wafer chuck. This means the white film and the transparent quartz wafer chuck are placed between the wafer and the CCD camera. However, this will decrease the imaging clarity of the CCD camera, and cause image identification errors which can lead to positional deviation of the marked lines on the back side of the wafer relative to the front side grooves. The back side scribing is done using the front side grooves as reference lines; if the marking machine is not well aligned with the grooves on the front side of the wafer, abnormal oblique cleavage of the wafer will occur. Since the back side dicing utilizes the back side marked lines as reference lines, the back side grooves may be skewed and misaligned with the front side grooves, negatively affecting the quality of the singulated chips. In summary, there are two main reasons that increases the risk of the back side grooves being skewed.

1. The back side marked lines are not well aligned with the grooves on the front side, causing the back side grooves to be misaligned with the grooves on the front side.

2. The back side marked lines are aligned with the laser grooves on the front side but the cutting blade does not align with the back side marked lines during the back side dicing. This produces extraneous back side marked lines on the finished chip, and causes mismatch between the front side and the back side of the chip.

FIG. 12 shows a chip singulated via the conventional singulating method and having a chip edge with an abnormal oblique cleavage profile. As described hereinbefore, the conventional singulating method is performed in a direction from a front side to a back side of a wafer (i.e., the direction from top to bottom of the wafer when the wafer is viewed from above). Referring to FIG. 1*b*, the back side dicing with a dicing blade proceeds from the right side to the left side of the wafer. When the wafer is subjected to a dicing force of the dicing blade at line (F), there is a relatively large disparity in length between a cleaved area and the uncleaved areas on two opposite sides of a cleaving force bearing point of the wafer. The above problems may increase wafer deformation and cause difficulty in aligning the dicing blade during the back side dicing. On the other hand, the conventional singulating method encounters problems, such as excessive time consumption, increased costs, and reduced production yield.

FIG. 7 shows a conventional chip 10 singulated via the conventional singulating method, and FIG. 8 shows a cross section of the conventional chip 10. As shown in FIGS. 7 and 8, the conventional chip 10 has pronounced segmentation of different layers on a side wall of the conventional chip 10. The side wall has a recast layer 11 near the front side of the wafer formed by wafer front side laser scribing, a diced segment 13 formed from wafer back side dicing near the back side of the wafer, and a middle cleaved segment 12 between the diced segment 13 and the recast layer 11. Formation of the recast layer 11, the middle cleaved segment 12 and the diced segment 13 of the side wall causes the side wall of the conventional chip 10 to be non-uniform. Additionally, the conventional singulating method involves several steps which increase the likelihood of non-alignment during the singulation of wafer, thereby causing greater deformation in the conventional chips 10 thus produced, and causing the thus singulated conventional chip 10 to have a non-vertical or oblique edge profile.

SUMMARY

Therefore, an object of the disclosure is to provide a wafer singulating method, an LED chip, and a light-emitting module that can alleviate at least one of the drawbacks of the prior art.

According to one aspect of the disclosure, the wafer singulating method includes: providing a wafer product having a front side and a back side opposite to each other, the front side of the wafer product being formed with a plurality of scribe lines; deep scribing the wafer product with a laser along the scribe lines from the front side of the wafer product to form a plurality of intersecting trenches on the front side of the wafer product; and cleaving the back side of the wafer product along the trenches on the front side of the wafer product. The cleaving proceeds in different directions each of which is directed to a center of the wafer product from a periphery of the wafer product. The cleaving in each of the directions proceeds along the trenches (101) one after the other from one of the trenches (101) nearest to the periphery of the wafer product and ceases near or at the center of the wafer product.

According to a second aspect of the disclosure, an LED chip includes a singulated wafer product having a front side and a back side disposed opposite to each other, and a cleaved side wall extending transversely between the front and back sides. An end of the cleaved side wall proximate to the front side is formed with a recast portion, and an end of the cleaved side wall proximate to the back side is a smooth side wall surface portion.

According to a third aspect of the disclosure, the light-emitting module includes a printed circuit board (PCB), and a light-emitting device disposed on the PCB. The light-emitting device includes the LED chip mentioned in the second aspect of the disclosure.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1A:
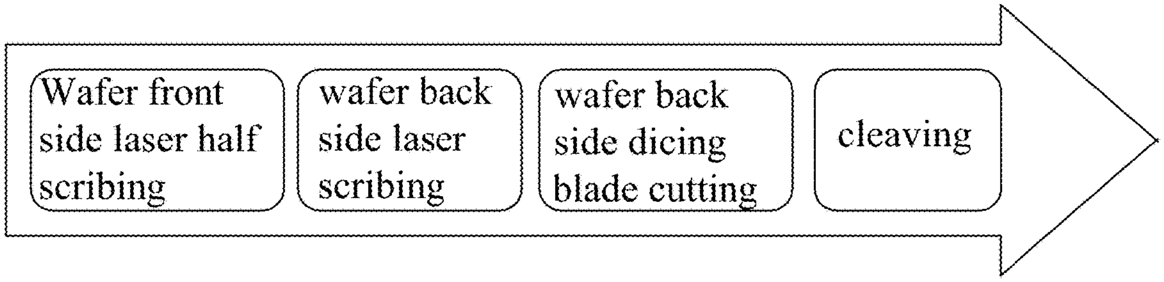
FIG. 1a PRIOR ART
FIG. 1*a* is a block diagram illustrating steps in a conventional wafer singulating method.
Figure 1B:
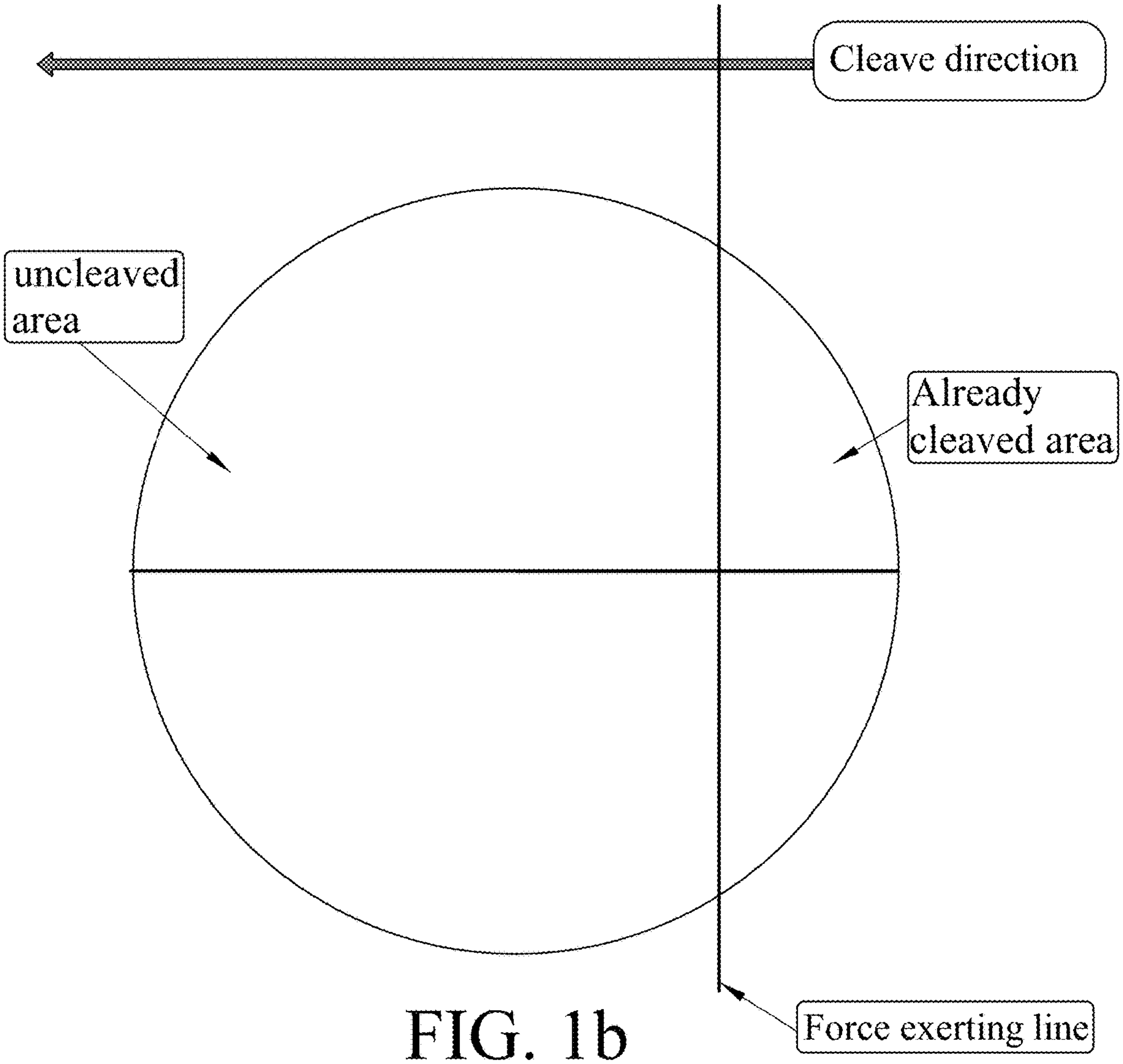
FIG. 1b PRIOR ART
FIG. 1*b* illustrates a wafer product and a direction of cleaving the wafer product according to the convention wafer singulating method.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

The implementation of the present disclosure will be illustrated below by way of specific examples, and other advantages and effects of the present disclosure can be readily appreciated by those skilled in the art based on the disclosure of the present specification. The present disclosure may also be implemented or applied in different embodiments, and the details of the present specification may also be based on different views and applications, and various modifications or changes may be made without departing from the spirit of the present disclosure.

First Embodiment

Figure 2:
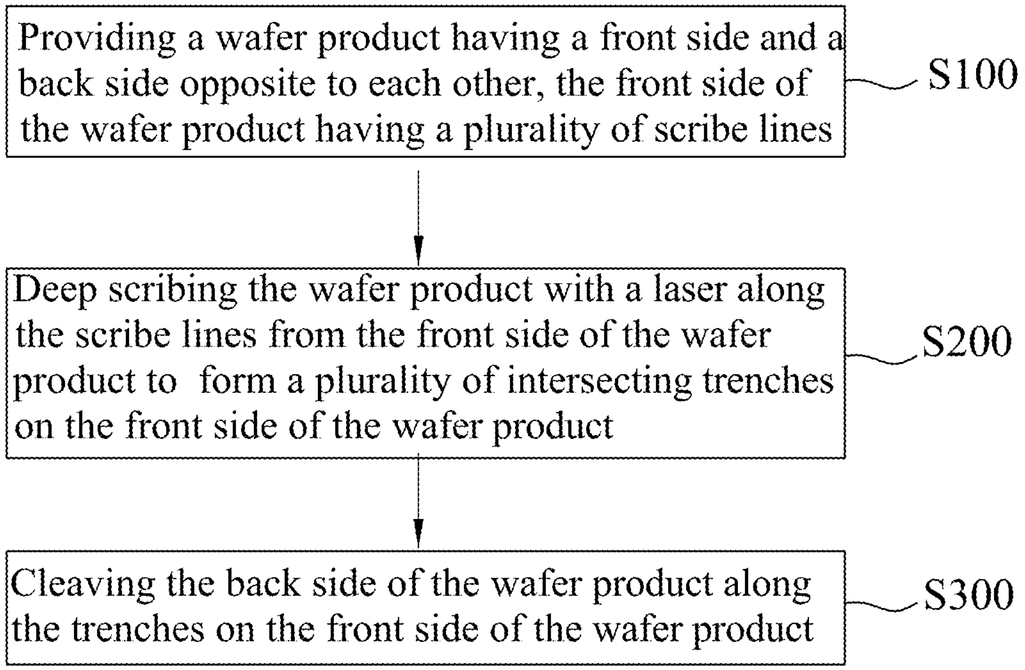
FIG. 2 is a block diagram illustrating steps in an embodiment of a wafer singulating method according to the present disclosure.
Figure 3:
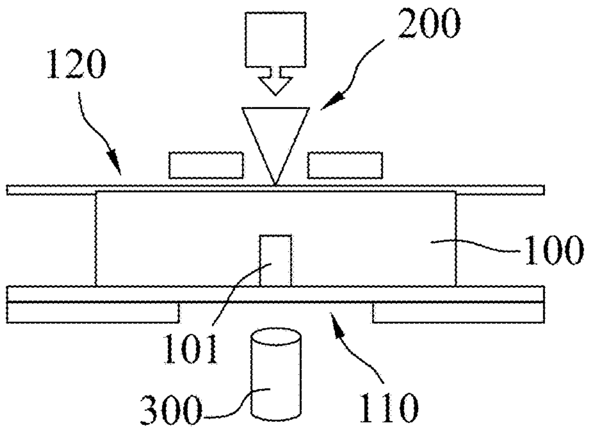
FIG. 3 is a schematic view illustrating a back side cleaving step of the wafer singulating method of the present disclosure.

Referring to FIGS. 2 and 3, the first embodiment of the disclosure is a wafer product singulating method that includes steps S100, S200, and S300.

In the step S100, a wafer product 100 is provided. The wafer product 100 has a front side 110 and a back side 120 opposite to each other. The front side 110 of the wafer product 100 is formed with a plurality of scribe lines (not shown).

In the step S200, the wafer product 100 is deep scribed with a laser along the scribe lines from the front side 110 of the wafer product 100 to form a plurality of intersecting trenches 101 on the front side 110 of the wafer product 100. In this embodiment, the scribe lines are formed via etching, and the trenches 101 are open grooves formed along the scribe lines via deep scribing. Furthermore, it should be noted that the trenches 101 are formed by deeply scoring the scribe lines to form deep open grooves. In other words, a high powered laser is used to ablate the scribe lines so that a ratio of a depth of the formed trenches 101 to a thickness of the wafer product is greater than 1:5. This is in contrast to laser scribing where a lower powered laser would be used to form the trenches 101 so that the trenches 101 would have a depth to thickness ratio of less than 1:5. In this embodiment, the ratio of the depth of the trenches 101 to the thickness of the wafer product 100 ranges from 1:5 to 1:2.

In the step S300, the back side 120 of the wafer product 100 is cleaved along the trenches 101 on the front side 110 of the wafer product 100. The cleaving proceeds in different directions each of which is directed to a center of the wafer product from a periphery of the wafer product. The cleaving in each of the directions proceeds along the trenches 101 one after the other from one of the trenches 101 nearest to the periphery of the wafer product and ceases near or at the center of the wafer product.

Referring further to FIG. 3, the wafer product 100 is placed on a dicing machine with the front side 110 of the wafer product 100 facing down and the back side 120 of the wafer product facing up. The wafer product 100 may be a bare wafer without any functional layers thereon, and may be a silicon wafer, a silicon carbide SiC wafer etc. In other embodiments, the wafer product 100 may already contain functional layers (semiconductor elements such as light-emitting diodes (LEDs), metal oxide semiconductors (MOS) etc.). The scribe lines are formed on the front side 110 of the wafer product 100 in a criss-cross arrangement. In this embodiment, the front side 110 of the wafer product 100 has an epitaxial layer which includes a first type semiconductor layer 1042, an active layer 1043, and a second type semiconductor layer 1044 sequentially arranged in a stack.

As shown in FIG. 3, the wafer product 100 is deep scribed with a laser beam 300 on the front side 110 of the wafer product 100 to form the plurality of intersecting trenches

101 on the front side 110 of the wafer product 100. In this embodiment, the wafer product 100 is deep scribed with the laser beam 300 along the scribe lines on the front side 110 of the wafer product 100 to form the plurality of intersecting trenches 101 on the front side 110 of the wafer product 100. In this embodiment, the ratio of the depth of the trenches 101 to the thickness of the wafer product 100 ranges from 1:5 to 1:2 which is conducive for subsequent cleaving. For example the depth to thickness ratio may be 1:4, 1:3, or 2:5.

The trenches 101 on the front side 110 of the wafer product 100 extend through the epitaxial layer 104A. More specifically, when the front side 110 of the wafer product 100 is formed with the epitaxial layer 104A, a depth of the trenches 101 is at least equal to a thickness of the epitaxial layer 104A. That is, the trenches 101 formed by deep scribing the front side 110 of the wafer product 100 at least extend through the entire thickness of the epitaxial layer 104A. The trenches 101 includes first and second trenches (L1, L2) that intersect each other (see FIG. 4). Then, as also shown in FIG. 3, the wafer product 100 is cleaved from the back side 120 of the wafer product 100 using a cutting blade 200, along the trenches 101 located on the front side 110 of wafer product 100. Compared to the conventional singulating method of the prior art, the wafer product singulating method of the present disclosure dispenses with the wafer product back side laser scribing and eliminates the problem of misalignment of back side laser scribe marks, the method also dispenses with the back side laser dicing and thus eliminates the problem of inducing abnormal oblique cleavage surfaces at singulated chip edges.

Figure 4:
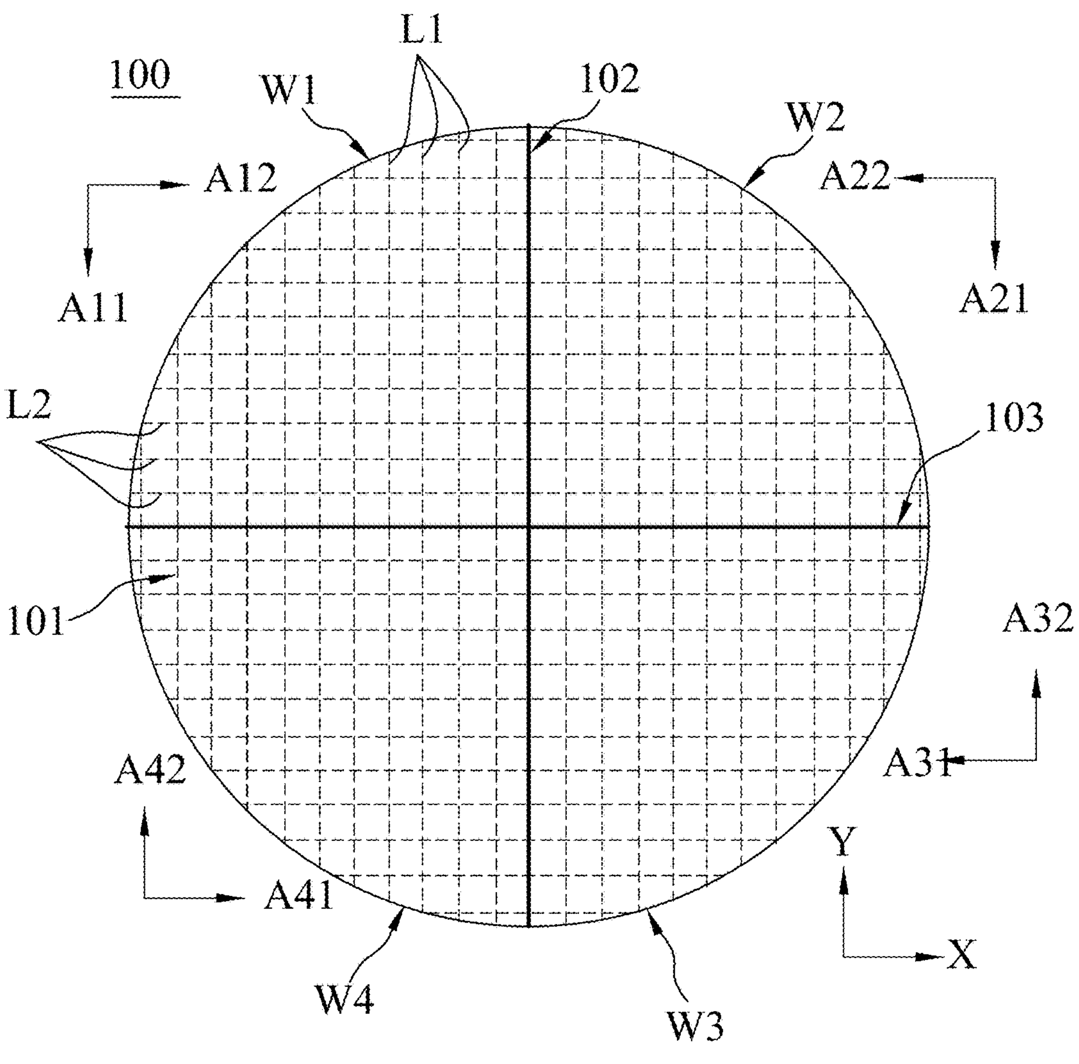
FIG. 4 is another schematic view illustrating the cleaving step of the wafer singulating method of the disclosure.

In the present embodiment, the step of cleaving is performed differently from the existing art, where the wafer product is cleaved sequentially from one side to the other side (e.g., from left to right). Referring to FIG. 4, in this embodiment, the wafer product 100 is first cleaved by using the cutting blade 200 cutting in a first direction (Y) and a second direction (X) on the back side 120 of the wafer product 100. The cleaving of the wafer product 100 proceeds in different directions: different X directions (see arrows A12, A22, A31, A41) and different Y directions (see arrows A11, A21, A32, A42).

More specifically, as shown in FIG. 4, the back side 120 of the wafer product 100 is first cleaved with the cutting blade 200 along a first straight line 102 that extends in the first direction (Y) and that passes through a geometric center of the wafer product 100, and a second straight line 103 that extends in the second direction (X) and that passes through the geometric center of the wafer product 100, so that the wafer product is divided into a first sub-wafer product (W1), a second sub-wafer product (W2), a third sub-wafer product (W3), and a fourth sub-wafer product (W4) which follow one after the other in a clockwise order. The first straight line 102 and the second straight line 103 pass through the center of the wafer product 100 and are perpendicular to each other.

Then, the back side of the wafer product 100 is cleaved along the first trenches (L1) that are parallel to the first straight line 102 by proceeding from one of the first trenches (L1) nearest to a first side of the periphery of the wafer product 100 to the other one of the first trenches (L1) nearest to the first straight line 102 so that each of the first sub-wafer product (W1) and the fourth sub-wafer product (W4) is diced to allow separation of cleaved parts in the second direction (X). More specifically, the wafer product 100 is repeatedly cleaved from one of the first trenches (L1) to a next first trench (L1) in an A11 direction while being cleaved in an A12 direction (see FIG. 4) along each of the first lines (L1). Next, the wafer product 100 is cleaved along the first trenches (L1) parallel to the first straight line 102 by proceeding from one of the first trenches (L1) nearest to a second side of the periphery of the wafer product 100 to the other one of the first trenches (L1) nearest to the first straight line 102 so that the second sub-wafer product (W2) and the third sub-wafer product (W3) are diced to allow separation of cleaved parts in the second direction (X). The second side is opposite to the first side along the second direction (X). More specifically, the wafer 100 is repeatedly cleaved from one of the trenches 101 to the next trenches 101 in an A21 direction while being cleaved in an A22 direction (see FIG. 4) along each of the first trenches (L1). Next, the wafer product 100 is cleaved along the second trenches (L2) parallel to the second straight line 103 by proceeding from one of the second trenches (L2) nearest to a fourth part of the periphery of the wafer product 100 to the other one of the second trenches (L2) nearest to the second straight line 103 so that the third sub-wafer product (W3) and the fourth sub-wafer product (W4) are diced to allow separation of cleaved parts in the first direction (Y). More specifically, the wafer 100 is repeatedly cleaved trench by trench in an A31 direction while progressively moving in an A32 direction (see FIG. 4) along each of the second lines (L2). Then, the wafer product 100 is cleaved along the second trenches (L2) parallel to the second straight line 103 by proceeding from one of the second trenches (L2) nearest to a third side of the periphery of the wafer product 100 to the other one of the second trenches (L2) nearest to the second straight line 103 so that the first sub-wafer product (W1) and the second sub-wafer product (W2) are diced to allow separation of cleaved parts in the first direction (Y). More specifically, the wafer product 100 is repeatedly cleaved in an A41 direction while progressively moving in an A42 direction along each of the second lines (L2). The above cleaving method reduces the risk of creating abnormal obliquely cleaved sidewall surfaces by reducing the length in the step S300, and allows the back side 120 of the wafer product 100 to be accurately cleaved along the trenches 101 on the front side 110 of the wafer product 100. The cleaving proceeds in different directions each of which is directed to a center of the wafer product 100 from a periphery of the wafer product 100. The cleaving in each of the directions proceeds along the trenches 101 one after the other from one of the trenches 101 nearest to the periphery of the wafer product and ceases near or at the center of the wafer product 100. This helps to induce perpendicular cleavage of the wafer product 100 along the laser scribed trenches 101, reduce defects, and improve production yields of singulated chips thereof. By omitting the back side laser scribing and the back side dicing with the cutting blade which are conducted in the conventional singulating method, the wafer product singulating method of the present disclosure reduces processing steps and is more optimized, and production yields may be increased. Additionally, material and equipment used for the back side laser scribing and back side dicing conducted in the conventional method may be spared and the method of the present disclosure is therefore more cost efficient.

Figure 11:
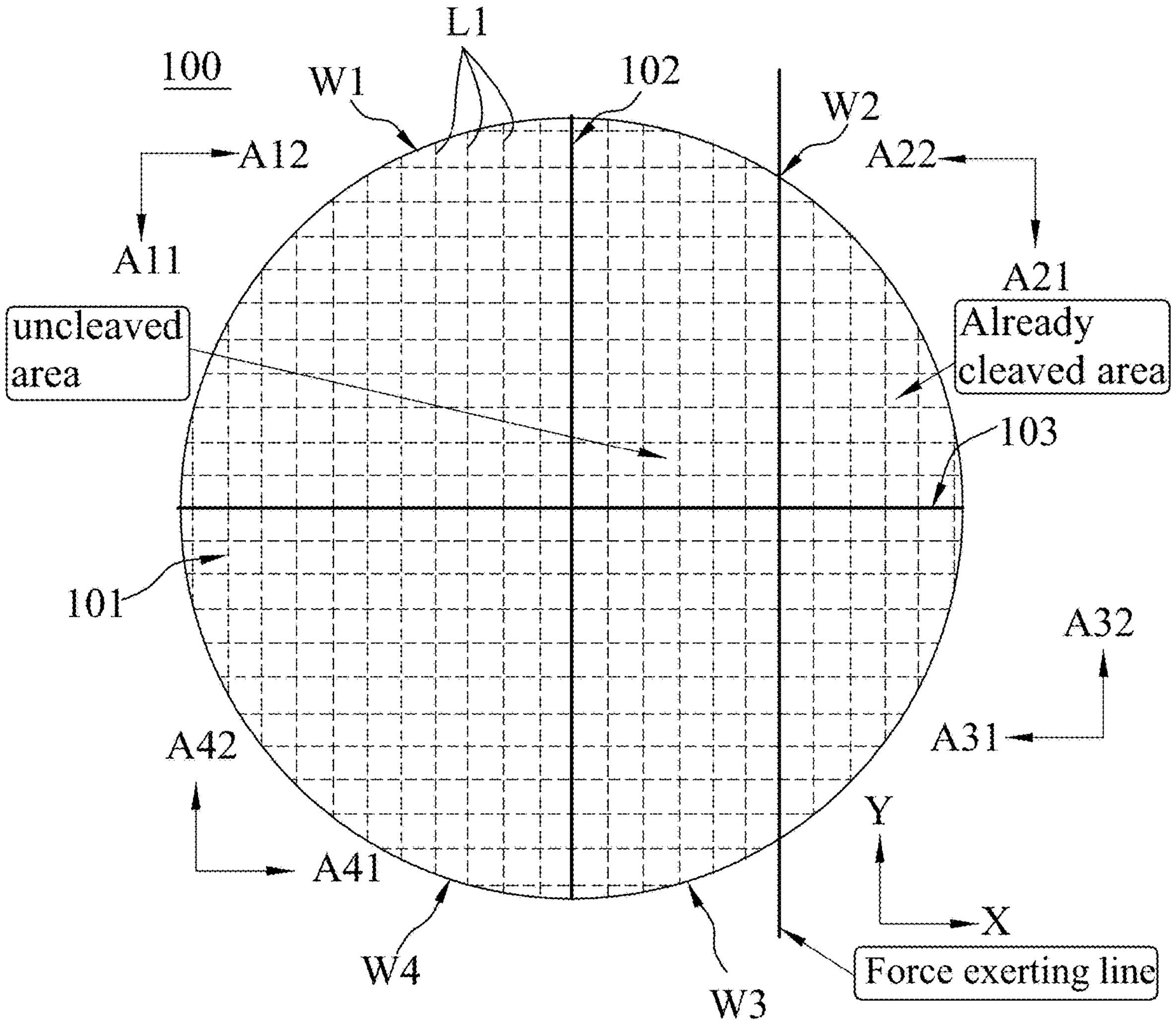
FIG. 11 is the same view as FIG. 4 but illustrating a cleaved area and an uncleaved area on two sides of a cleaving force bearing point during the cleaving step of the wafer singulating method.
Figure 12:
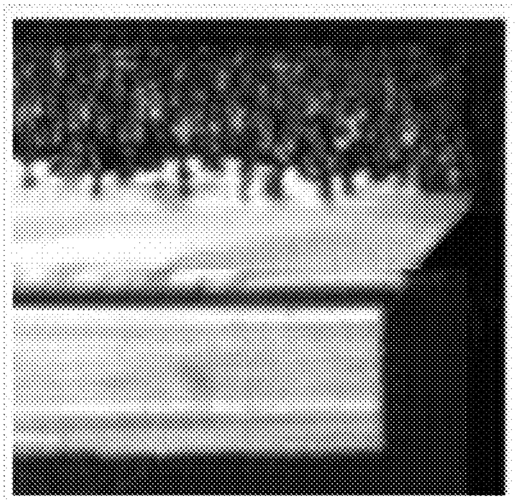
FIG. 12 is a fragmentary enlarged view illustrating an obliquely cleaved chip edge profile of a conventional chip singulated via the conventional laser dicing method.

Referring to FIG. 11, in the cleaving step according to the present disclosure, the wafer product 100 is first divided into the first to fourth sub-wafer products W1, W2, W3, and W4, and the cleaving proceeds from one side of the periphery of the wafer product 100 and stops near the center line (i.e., the first straight line 102, and the second straight line 103) that passes through the center of the wafer product 100. When the sub-wafer product W2 is cleaved along one of the first trenches (L1) (see the line depicted by W2), the cleaving force bearing point is along the line W2, and an already cleaved area and an uncleaved area are on two sides of the line W2. Compared to the conventional singulating method which does not produce sub-wafer products, in the singulating method of the present disclosure, each sub-wafer product W1, W2, W3, W4 has its already cleaved area and uncleaved area with reduced lengths on two sides of a force bearing line W2. This reduces wafer product deformation during the cleaving of the wafer product 100 and thus reduces defects and improves yield. It should be noted that the order and sequence of the cleaving is not limited to the sequence described in the disclosure; the sequence of the cleaving proceeding from any one of the first to fourth parts of the periphery along the first straight line 102 or second straight line 103, and may be adjusted according to practical requirements.

Second Embodiment

Figure 5:
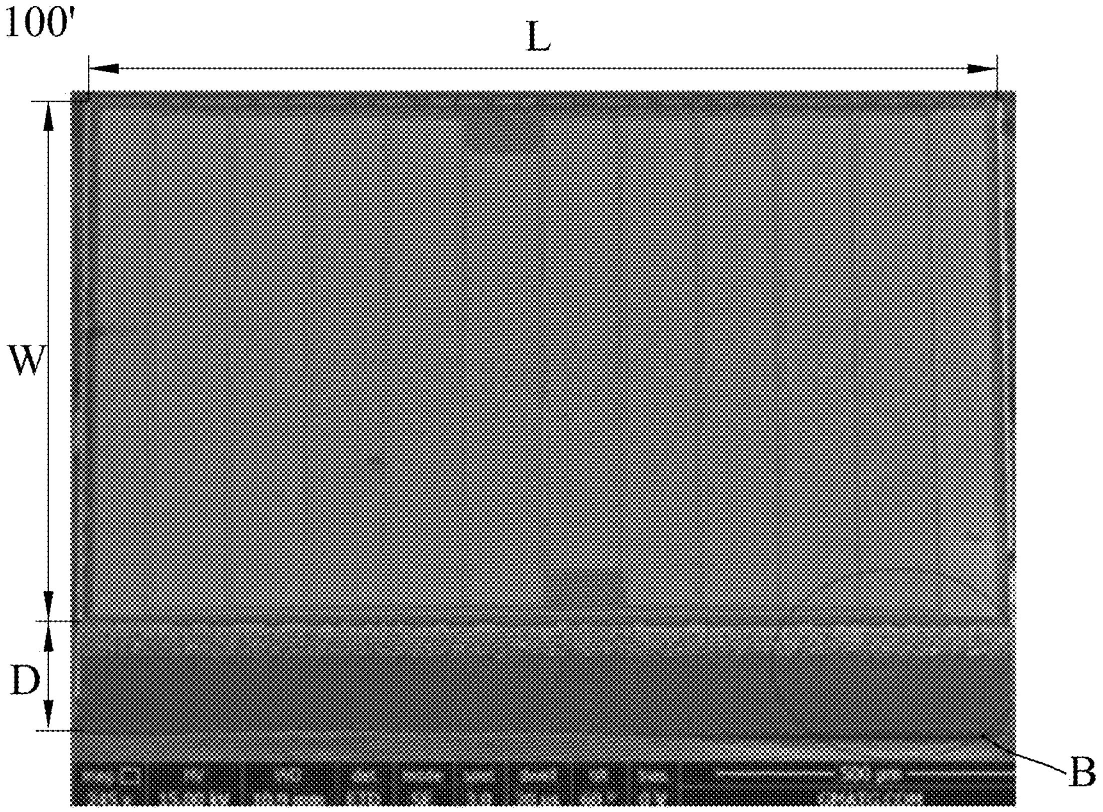
FIG. 5 is a schematic view illustrating an LED chip of a second embodiment according to the present disclosure, which is produced by the wafer singulating method of the first embodiment.
Figure 6:
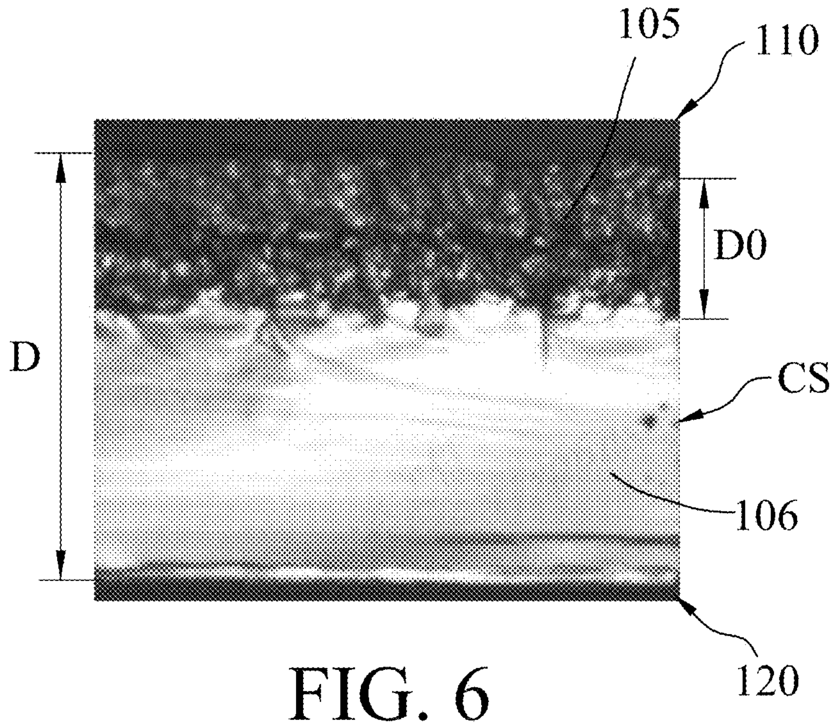
FIG. 6 is a fragmentary enlarged view of the LED chip in FIG. 5, illustrating a cleaved side wall of the LED chip.
Figure 7:
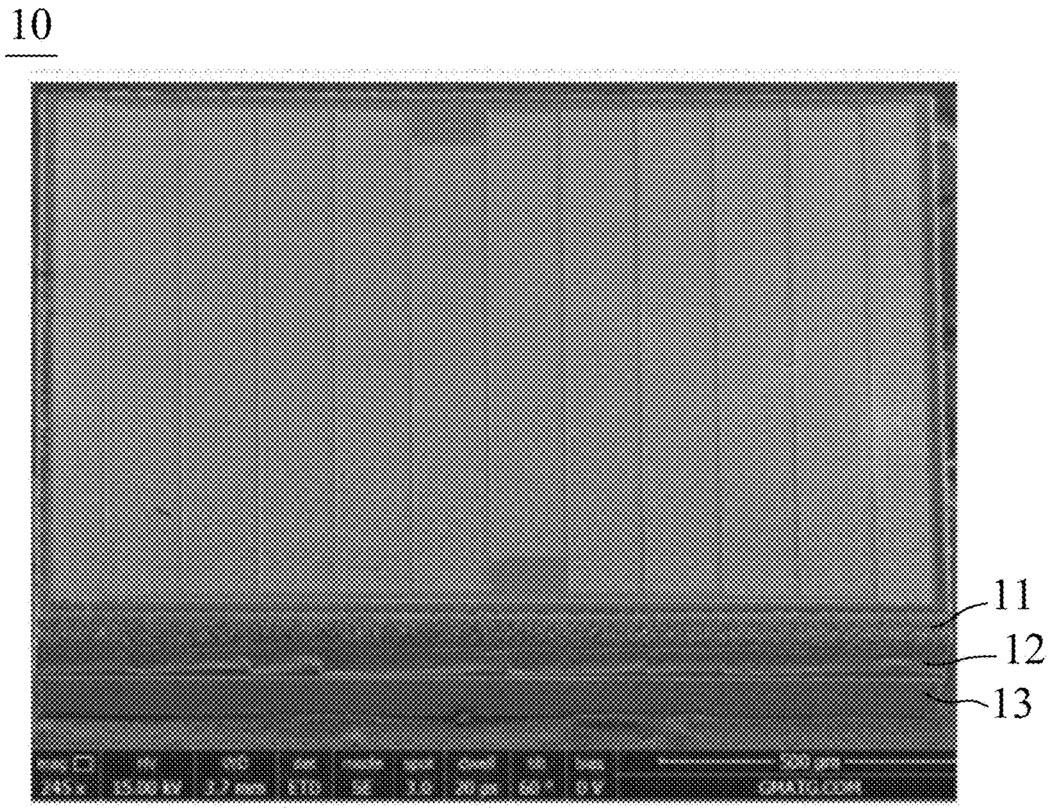
FIG. 7 PRIOR ART
FIG. 7 is a schematic view illustrating a conventional LED chip singulated via a conventional wafer singulating method.
Figure 8:
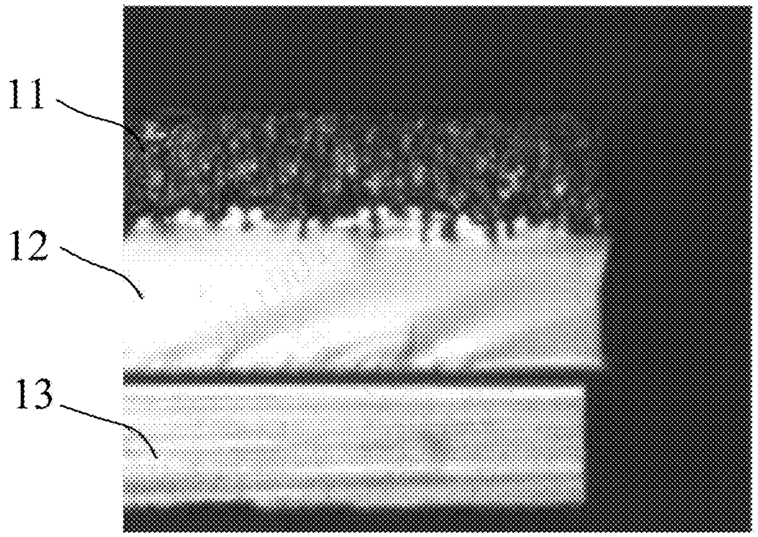
FIG. 8 PRIOR ART
FIG. 8 is a fragmentary enlarged view of the conventional LED chip in FIG. 7.

The second embodiment provides an LED chip 104 produced by the singulating method of the first embodiment. FIGS. 5 and 6 show photographs taken by a scanning electron microscope (SEM) of an LED chip 104 which includes a singulated wafer product 100'. Referring to FIGS. 7 and 8, the conventional chip 10 obtained from the conventional singulating method has a side wall having a recast layer segment 11 near a front side of the conventional chip 10 formed by the front side laser scribing, a diced segment 13 resulting from the back side dicing with the cutting blade near the back side of the conventional chip 10, and a cleaved segment 12 on a middle section between the diced segment 13 and the recast layer segment 11. Due to the obliquely cleaving of the wafer product (chip 10) in the conventional singulating method, the side wall of the conventional chip 10 manifests distinctive misalignment appearance occurring between the above segments 11, 12, 13. In contrast, the wafer singulating method of the present disclosure essentially conducts the laser deep scribing on the front side 110 and the back side dicing with the cutting blade to obtain the LED chips 104. Referring to FIGS. 5 and 6, an LED chip 104 singulated via the wafer singulating method of the present disclosure has a cleaved side wall (CS) with relatively neat cleaved surfaces. The cleaved side wall (CS) extending transversely between the front side 110 and the back side 120. An end of the cleaved side wall (CS) proximate to the front side 110 is formed with a recast portion 105, and an end of the cleaved side wall (CS) proximate to the back side 120 has a smooth side wall surface 106. Apart from the recast portion 105 and the smooth side wall surface portion 106, the cleaved side wall (CS) has no other surface irregularities and abnormally cleaved surfaces. The cleaved side wall (CS) is relatively uniform in appearance. Additionally, in the method of the present disclosure, the wafer product 100 is perpendicularly cleaved along the trenches 101, and the LED chip 104 thus obtained has the back side 120 with a smooth edge and without any knife marks. An angle between the cleaved side wall (CS) and the front and/or back sides 110, 120 ranges from 85° to 95°. In some embodiments, the cleaved side wall (CS) is substantially vertical and the angle between the cleaved side wall (CS) and each of the front or back sides 110, 120 approaches 90°.

Referring to FIG. 5, the LED chip 104 has a rectangular cross section on a plane perpendicular to a thickness direction of the singulated wafer product 100'. The LED chip 104 as shown in FIG. 5 has a length (L), a width (W), and the cleaved side wall (CS) has a thickness (D) The LED chip 104 may have its length (L) equal to its width (W). In other words, the LED chip 104 may have a square cross section. Referring to FIG. 6, in some embodiments, a ratio of a thickness (D0) of the recast portion 105 to a thickness (D) of the cleaved side wall (CS) may range from 1:5 to 1:2. For example, the ratio may be 1:4, 1:3, 2:5. In this embodiment, the ratio of the length (L) or width (W) of the singulated wafer product 100' to the thickness (D) of the cleaved side wall (CS) is no less than 4.

Referring to FIGS. 5 to 7, comparing the LED chip 104 of the disclosure with the conventional chip 10, the cleaved side wall (CS) of the LED chip 104 is smooth and substantially vertical with the angle between the cleaved side wall (CS) and the back side 120 ranging from 85° to 95°. This ensures the performance stability of the LED chip 104 and improves production yield.

Figure 9:
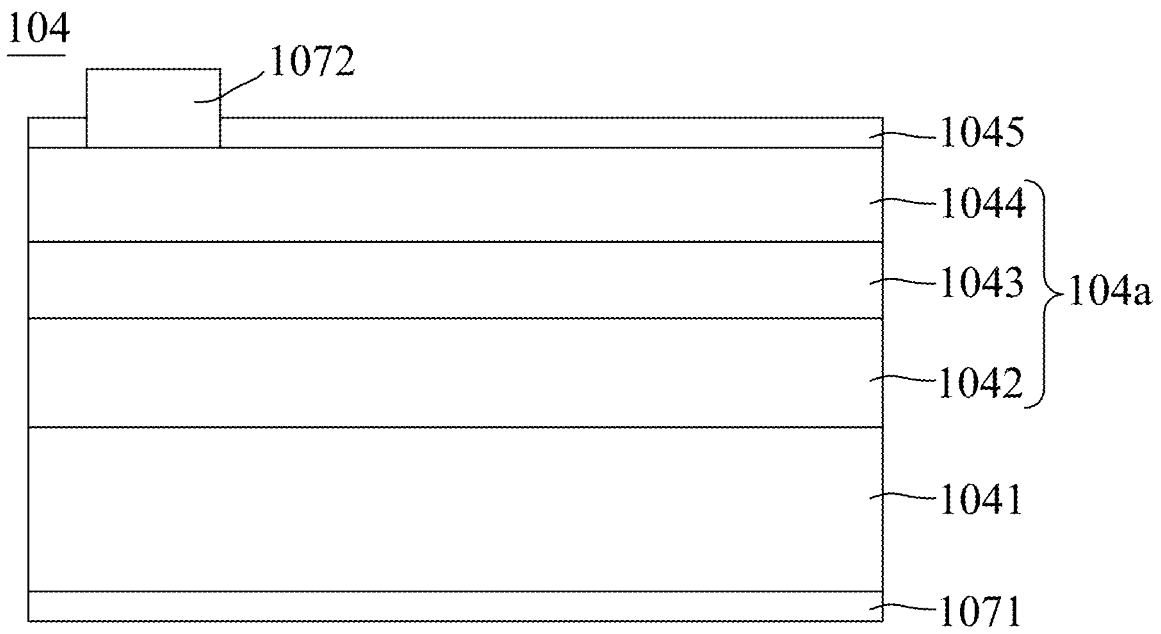
FIG. 9 is a schematic cross-sectional view illustrating a variation of the LED chip of the second embodiment.

Referring to FIG. 9, in a variation of the second embodiment, the LED chip 104 includes a wafer product 1041 having the oppositely disposed front and back sides. The front side of the LED chip 104 is a functional side and includes an epitaxial layer 104A formed on the front side that includes a first type semiconductor layer 1042, an active layer 1043, and a second type semiconductor layer 1044, sequentially arranged in a stack. The LED chip 104 further includes an electrode structure including a first electrode 1071 that is formed on the epitaxial layer 104A and that is electrically connected to the first type semiconductor layer 1042, and a second electrode 1072 that is formed on the second type semiconductor layer 1044 and that is electrically connected to the second type semiconductor layer 1044. Referring to FIG. 9, the LED chip 104 further includes an insulating layer 1045 that electrically isolates the electrode structure from other areas of the epitaxial layer 104A, and protects the LED chip 104.

In some embodiments, the epitaxial layer is made of GaAs. The first type semiconductor layer 1042 is an N—GaAs layer, and the second type semiconductor layer 1044 is a P—GaAs layer. Referring to FIG. 9, the LED chip 104 has vertical side walls.

Figure 10:
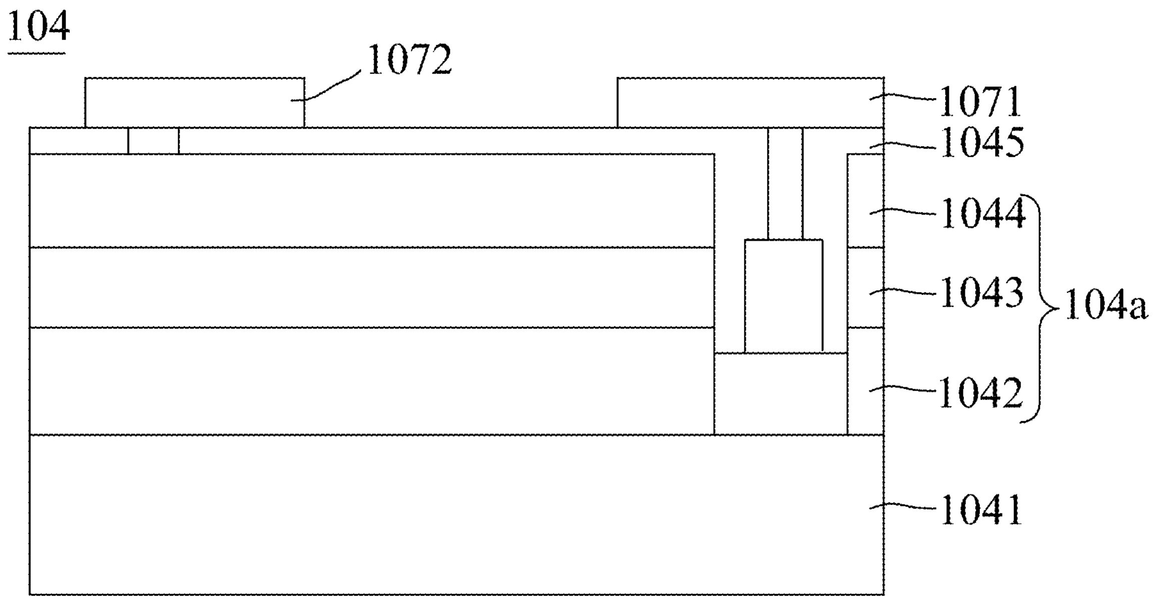
FIG. 10 is a schematic cross-sectional view illustrating another variation of the second embodiment.

Referring to FIG. 10, in another variation of the second embodiment, the front side of the LED chip 104 is a functional side and includes an epitaxial layer 104A formed on the front side 110 of the wafer product layer 1041, and includes a first type semiconductor layer 1042, an active layer 1043, and a second type semiconductor layer 1044 sequentially arranged in a stack. The LED chip 104 has an electrode structure including a first electrode 1071 that is formed on the back side 120 of the wafer product layer 1041 and that is electrically connected to the first type semiconductor layer 1042, and a second electrode 1072 that is formed on the second type semiconductor layer 1044 and that is electrically connected to the second type semiconductor layer 1044. In this variation the LED chip 104 is an LED flip-chip packaged device. The LED chip 104 of the second embodiment has superior side wall characteristics. The cleaved side wall (CS) is substantially vertical, and an angle between the cleaved side wall (CS) and the front and/or back sides is close to 90°. This allows the LED chip 104 to have good external appearance, ensures chip operation stability, and provides good production yield.

Third Embodiment

In the third embodiment of the disclosure, a light-emitting module includes a printed circuit board (PCB), and a light-emitting device disposed on the PCB. The light-emitting device may be the LED chip 104 of the second embodiment of the present disclosure. Because the LED chips 104 according to the present disclosure are singulated to have few defects and good electrical characteristics, the light-emitting module will also have good electrical characteristics.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A wafer singulating method comprising:

providing a wafer product having a front side and a back side opposite to each other, the front side of the wafer product having a plurality of scribe lines;

deep scribing the wafer product with a laser along the scribe lines from the front side of the wafer product to form a plurality of intersecting trenches on the front side of the wafer product;

cleaving the back side of the wafer product along the trenches on the front side of the wafer product;

wherein the cleaving proceeds in different directions each of which is directed to a center of the wafer product from a periphery of the wafer product, and the cleaving in each of the directions proceeds along the trenches one after the other from one of the trenches nearest to the periphery of the wafer product and ceases near or at the center of the wafer product; and wherein, before the cleaving proceeds along the trenches, the wafer product is cleaved into multiple sub-wafers, and each of the sub-wafers is cleaved from the periphery of the wafer product toward the center of the wafer product.

2. The wafer singulating method as claimed in claim 1, wherein the wafer product is cleaved into the sub-wafers along at least one straight line passing through the center of the wafer product.

3. The wafer singulating method as claimed in claim 1, wherein a ratio of a depth of the trench to a thickness of the wafer product ranges from 1:5 to 1:2.

4. The wafer singulating method as claimed in claim 3, wherein the trenches include first and second trenches intersecting each other, the step of cleaving the wafer product includes:

cleaving the back side of the wafer product along a first straight line that extends in a first direction and that passes through a geometric center of the wafer product, and a second straight line that extends in a second direction and that passes through the geometric center of the wafer product, so that the wafer product is divided into a first sub-wafer, a second sub-wafer, a third sub-wafer, and a fourth sub-wafer which follow one after the other in a clockwise order;

cleaving the back side of the wafer product along the first trenches that are parallel to the first straight line by proceeding from one of the first trenches nearest to a first side of the periphery of the wafer product to the other one of the first trenches nearest to the first straight line so that each of the first sub-wafer and the fourth sub-wafer is diced to allow separation of cleaved parts in the second direction;

cleaving the wafer product along the first trenches parallel to the first straight line by proceeding from one of the first trenches nearest to a second side of the periphery of the wafer product to the other one of the first lines nearest to the first straight line so that the second sub-wafer and the third sub-wafer are diced to allow separation of cleaved parts in the second direction, the second side being opposite to the first side along the second direction;

cleaving the wafer product along the second trenches parallel to the second straight line by proceeding from one of the second trenches nearest to a third side of the periphery of the wafer product to the other one of the second trenches nearest to the second straight line so that the first sub-wafer and the second sub-wafer are diced to allow separation of cleaved parts in the first direction; and cleaving the wafer product along the second trenches parallel to the second straight line by proceeding from one of the second trenches nearest to a fourth side of the periphery of the wafer product to the other one of the second trenches nearest to the second straight trenches so that the third sub-wafer and the fourth sub-wafer are diced for separation of cleaved parts in the first direction, the third and fourth sides being opposite in the first direction.

5. The wafer singulating method as claimed in claim 1, wherein the front side of the wafer product further includes an epitaxial layer that has a first type semiconductor layer, an active layer, and a second type semiconductor layer sequentially arranged in a stack.

6. The wafer singulating method as claimed in claim 5, wherein the trenches formed by deep scribing the front side of the wafer product extend through the epitaxial layer.

7. A wafer singulating method comprising:

providing a wafer product having a front side and a back side opposite to each other, the front side of the wafer product having a plurality of scribe lines;

deep scribing the wafer product with a laser along the scribe lines from the front side of the wafer product to form a plurality of intersecting trenches on the front side of the wafer product;

cleaving the back side of the wafer product along the trenches on the front side of the wafer product;

wherein the cleaving proceeds in different directions each of which is directed to a center of the wafer product from a periphery of the wafer product, and the cleaving in each of the directions proceeds along the trenches one after the other from one of the trenches nearest to the periphery of the wafer product and ceases near or at the center of the wafer product;

wherein a ratio of a depth of the trench to a thickness of the wafer product ranges from 1:5 to 1:2; and wherein the trenches include first and second trenches intersecting each other, the step of cleaving the wafer product includes:

cleaving the back side of the wafer product along a first straight line that extends in a first direction and that passes through a geometric center of the wafer product, and a second straight line that extends in a second direction and that passes through the geometric center of the wafer product, so that the wafer product is divided into a first sub-wafer, a second sub-wafer, a third sub-wafer, and a fourth sub-wafer which follow one after the other in a clockwise order;

cleaving the back side of the wafer product along the first trenches that are parallel to the first straight line by proceeding from one of the first trenches nearest to a first side of the periphery of the wafer product to the other one of the first trenches nearest to the first straight line so that each of the first sub-wafer and the fourth sub-wafer is diced to allow separation of cleaved parts in the second direction;

cleaving the wafer product along the first trenches parallel to the first straight line by proceeding from one of the first trenches nearest to a second side of the periphery of the wafer product to the other one of the first lines nearest to the first straight line so that the second sub-wafer and the third sub-wafer are diced to allow separation of cleaved parts in the second direction, the second side being opposite to the first side along the second direction;

cleaving the wafer product along the second trenches parallel to the second straight line by proceeding from one of the second trenches nearest to a third side of the periphery of the wafer product to the other one of the second trenches nearest to the second straight line so that the first sub-wafer and the second sub-wafer are diced to allow separation of cleaved parts in the first direction; and cleaving the wafer product along the second trenches parallel to the second straight line by proceeding from one of the second trenches nearest to a fourth side of the periphery of the wafer product to the other one of the second trenches nearest to the second straight trenches so that the third sub-wafer and the fourth sub-wafer are diced for separation of cleaved parts in the first direction, the third and fourth sides being opposite in the first direction.

* * * * *